United States Patent
Lin et al.

(10) Patent No.: US 8,268,514 B2
(45) Date of Patent: Sep. 18, 2012

(54) PELLICLE MOUNTING METHOD AND APPARATUS

(75) Inventors: Jiin-Hong Lin, Jhubei (TW); Chih-Chen Chen, Hsin-Chu (TW); Ming-Tao Ho, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 788 days.

(21) Appl. No.: 12/359,752

(22) Filed: Jan. 26, 2009

(65) Prior Publication Data
US 2010/0190095 A1    Jul. 29, 2010

(51) Int. Cl.
G03F 1/14 (2011.01)
G03B 27/64 (2006.01)

(52) U.S. Cl. ............................ 430/5; 355/75; 355/76
(58) Field of Classification Search ........ 430/5; 355/75, 355/76
See application file for complete search history.

(56) References Cited

U.S. PATENT DOCUMENTS

| | | | |
|---|---|---|---|
| 4,443,098 A | 4/1984 | Walwyn et al. | |
| 4,637,713 A | 1/1987 | Shulenberger et al. | |
| 5,042,655 A | 8/1991 | Beldyk et al. | |
| 5,311,250 A | 5/1994 | Suzuki et al. | |
| 5,772,817 A | 6/1998 | Yen et al. | |
| 6,264,773 B1* | 7/2001 | Cerio | 156/64 |
| 6,475,575 B1 | 11/2002 | Ikuta et al. | |
| 6,503,464 B1* | 1/2003 | Miki et al. | 422/186.3 |
| 6,593,034 B1 | 7/2003 | Shirasaki | |
| 6,619,359 B2 | 9/2003 | Ballard et al. | |
| 6,715,495 B2* | 4/2004 | Dao et al. | 134/1.1 |
| 6,720,116 B1 | 4/2004 | Tzu et al. | |
| 6,727,029 B1 | 4/2004 | Wu et al. | |
| 6,803,161 B2 | 10/2004 | Shirasaki | |
| 7,061,589 B2 | 6/2006 | Lin | |
| 7,151,593 B2 | 12/2006 | Lin | |
| 2003/0207182 A1 | 11/2003 | Shirasaki | |
| 2004/0200572 A1* | 10/2004 | Tejnil et al. | 156/345.1 |
| 2007/0264582 A1 | 11/2007 | Chang et al. | |
| 2008/0199783 A1 | 8/2008 | Chang et al. | |
| 2008/0251100 A1 | 10/2008 | Shimada et al. | |

OTHER PUBLICATIONS

"Wafter carrier evolved," EuroAsia Semiconductor, Jun. 2008, 4 pages.
Matsushita Seiki Co., Ltd., Semiconductor-FPD Field, Auto Pellicle Mounter specifications, © 2004, 1 page.
Micro Lithography, Inc. Pellicle Mounter product description, © 2003, 3 pages.
M. Devid Levenson, Rave "Rhazers" Reticle Haze, Microlithography World, Jul. 2008, 4 pages.
Matsushita Seiki Co., Ltd., Semiconductor-FPD Field, Manual Pellicle Mounter specifications, © 2004, 1 page.

(Continued)

Primary Examiner — Mark F Huff
Assistant Examiner — Jonathan Jelsma
(74) Attorney, Agent, or Firm — Duane Morris LLP

(57) ABSTRACT

Apparatus is provided for mounting a pellicle to a photomask. A chamber has at least one port for filling the chamber with extreme clean dry air (XCDA) or an inert gas. A pellicle mounter is provided within the chamber. A vacuum ultra violet (VUV) light source is provided for irradiating a mask held by the pellicle mounter while the chamber is filled with the XCDA or inert gas. The mask is irradiated with the VUV light in an atmosphere of the XCDA or inert gas, and the pellicle is mounted to the mask while the mask is in the atmosphere of the XCDA or inert gas and exposed to the VUV light.

8 Claims, 5 Drawing Sheets

OTHER PUBLICATIONS

Clarilite Certified System, A Solution to Prevent Reticle Haze, http://www.entegris.com/Resources/assets/clarilite.pdf visited Jan. 26, 2009, © 2007 Entegris Corp.

Entegris—A New Solution for Reticle Haze Prevention, Clarilite White Paper, © 2007 Entegris, Inc., 2 pages.

Oleg Kishkovich et al., A Practical Solution to the Critical Problem of 193 nm Reticle Haze, http:www.entegris.com/resources/assets/SPIE2007_193nmReticleHaze.pdf © 2007, Entegris Corp., visited Jan. 26, 2009.

* cited by examiner

PELLICLE MOUNTING METHOD AND APPARATUS

FIELD OF THE INVENTION

The present disclosure relates to methods and apparatus for mounting a pellicle to a photomask.

BACKGROUND

A reticle or photomask is a precision glass plate containing circuit layouts for use in a semiconductor fabrication process. If any dust or contaminant particles become attached to the reticle, such particles may result in artifacts on the printed circuits. A pellicle is a thin piece of transparent material mounted at a distance from the mask (reticle). The distance is chosen so that any dust or particles on the pellicle are out of focus when the wafer is in focus. Thus, any foreign particles that have fallen on the surface of the pellicle are not projected on the wafer, and do not contribute to printing defects.

Even with the use of a pellicle, other factors contribute to printing defects. One of these problems is reticle haze. It is well-known that haze is caused by the chemicals, SOx & NHx (e.g., $SO_2$ and $NH_3$) which are generated during the mask making process, and react with moisture. These chemicals may result from outgassing of materials used in making the masks, wet chemicals including sulphuric acid and hydrogen peroxide, and/or impurities from handling the masks. When these chemicals and moisture are present and exposed to ultraviolet (UV) light (such as the light used to expose a pattern onto a wafer), ammonium sulfate crystals grow, causing reticle haze. Thus, the life of the reticle can be shortened by formation of reticle haze crystals, which increase each time the mask is exposed to DUV (deep UV) light.

In order to retard or prevent the formation of haze, foundries have stored masks in controlled environments (e.g., storage in an inert gas) and employed "purge" operations to remove contaminants. A purge operation typically places the mask in an environment of pure nitrogen or extreme clean dry air (XCDA). Both of these environments can remove moisture and ammonia reactants from the mask, to avoid haze formation. For example, a purge operation may be performed immediately before and immediately after using the mask in a scanner.

U.S. Pat. No. 6,593,034 describes a pellicle frame having two gas passage openings. The pellicle frame is adapted for replacing the air in the space between the mask and the pellicle with an inert gas, such as nitrogen, helium, argon or the like. The frame has a pair of openings, for feeding the inert gas into the space and for exhausting the gas from the space. The openings have filters which prevent subsequent infiltration of large particles. This configuration eliminates haze at the time the pellicle is mounted, but haze can still form subsequently during use.

Thus, improved methods of preventing reticle haze are desired.

SUMMARY OF THE INVENTION

In some embodiments, a method comprises irradiating a mask with a vacuum ultra violet (VUV) light in an atmosphere of extreme clean dry air (XCDA) or an inert gas, and mounting a pellicle to the mask while the mask is in the atmosphere of XCDA or the inert gas and exposed to the VUV light.

In some embodiments, an apparatus for mounting a pellicle to a mask comprises a sealable chamber having at least one port for filling the sealable chamber with XCDA or an inert gas. A pellicle mounter is provided within the sealable chamber. A vacuum ultra violet light source is provided for irradiating a mask held by the pellicle mounter while the chamber is filled with the XCDA or inert gas.

In some embodiments, a product comprises a mask, a pellicle frame sealingly attached to the mask, and a pellicle joined to the pellicle frame. A sealed enclosure is formed, bounded by the mask, the pellicle frame and the pellicle. The sealed enclosure is filled with XCDA or an inert gas. The assembly is formed by: irradiating the mask with a vacuum ultraviolet light in an XCDA or inert gas atmosphere, and sealing the mask, the pellicle frame and the pellicle together in the XCDA or inert gas atmosphere.

DETAILED DESCRIPTION

Figure 1:
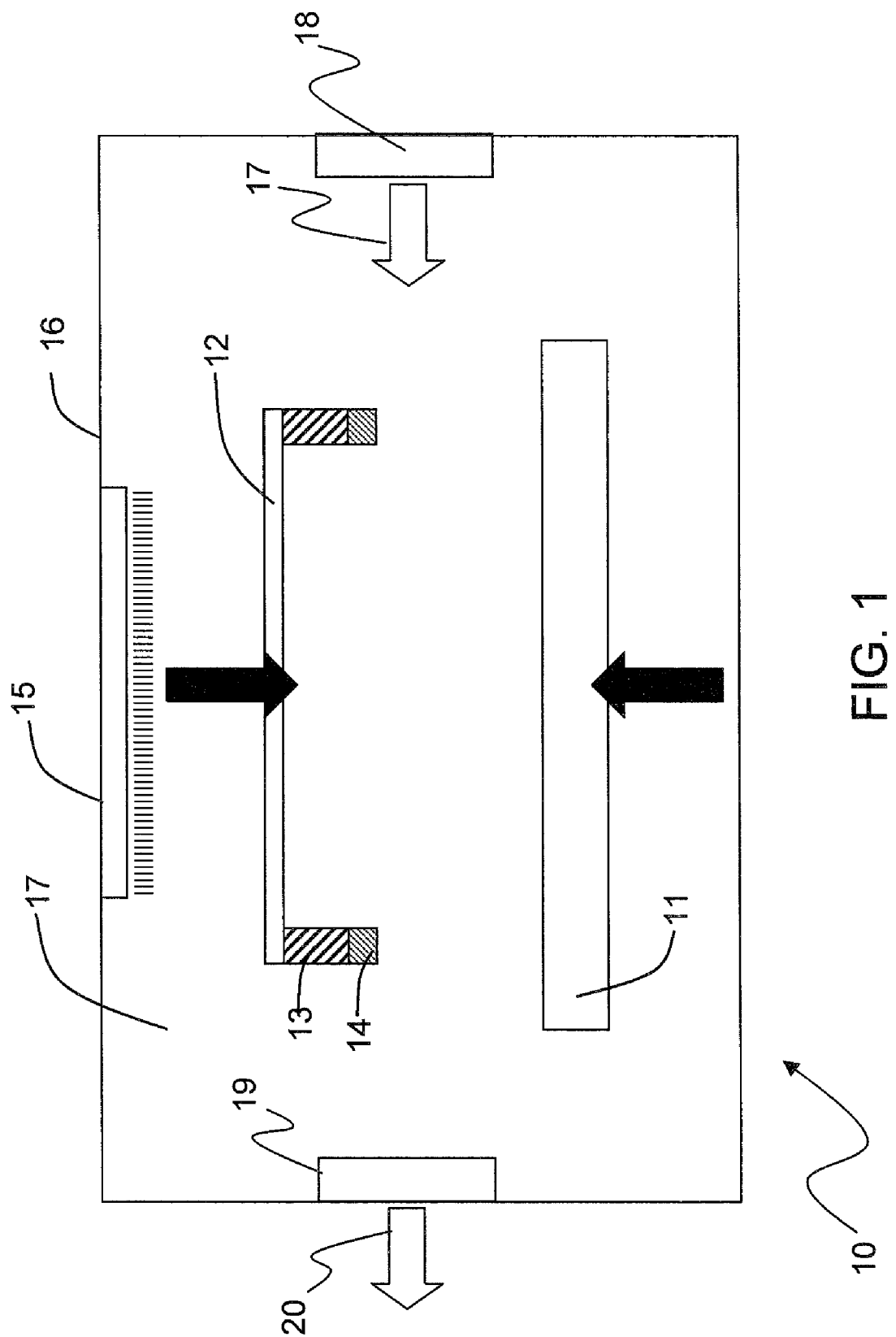
FIGS. 1 and 2 are schematic diagrams of a process for mounting a pellicle on a mask.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 2:
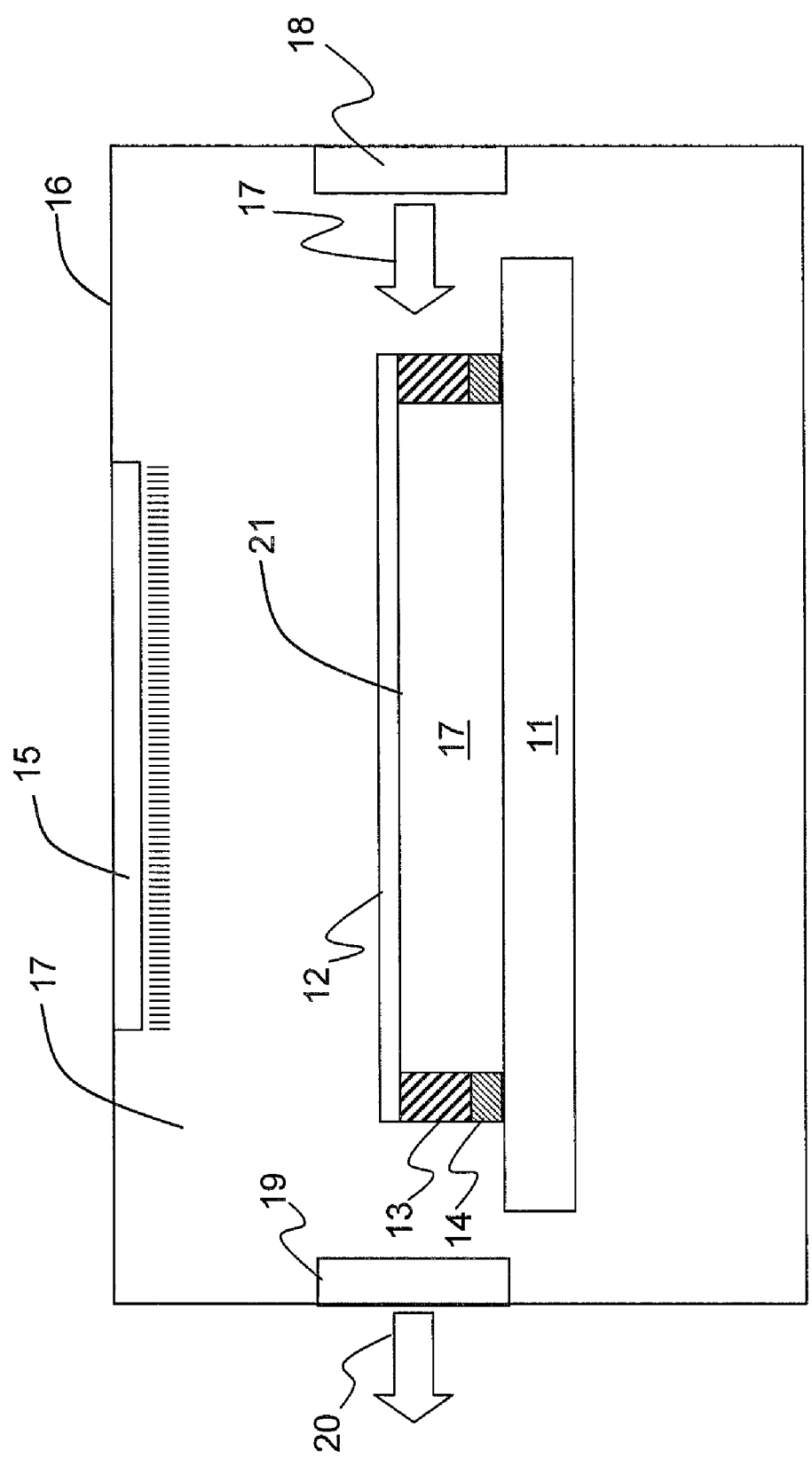

FIGS. 1 and 2 are schematic diagrams of a process for mounting a pellicle 12 to a photomask 11. FIG. 1 shows the pellicle 12 and pellicle frame 13 above the photomask 11 in preparation for joining the pellicle frame 13 to the photomask 11. FIG. 2 shows the photomask 11, pellicle frame 13, and pellicle 12 joined together.

The method includes irradiating a mask 11 with a vacuum ultra violet (VUV) light 15 in an atmosphere of extreme clean dry air (XCDA) or an inert gas 17, and mounting a pellicle 12 to the photomask 11 while the photomask 11 is in the atmosphere of XCDA or the inert gas 17 and exposed to the VUV light.

The mask 11 may be made of a suitable transparent material such as glass, quartz, or $CaF_2$, upon which a pattern is formed of an opaque material, such as chrome. If the mask is a phase-shifting mask, a phase shifting layer is provided below the chrome layer. In some embodiments, the phase shift layer may include any element selected from among transition metals, lanthanoids and combinations thereof. Examples include, Mo, Zr, Ta, Cr and Hf. In one example, the metal containing layer is formed of either MoSi, MoSiON or Cr.

The pellicle 12 may be one of a variety of types, such as Film 703 Deep UV film sold be by Micro Lithography, Inc. (MLI) of Sunnyvale, Calif., which has a high transmittance for 193 nm, 248 nm, and 365 nm wavelength light. Other pellicle materials that may be used include, but are not limited to, nitrocellulose, fluororesin, "CYTOP" manufactured by Asahi Glass Co., Ltd. of Tokyo, Japan, "FLON AF" resin manufactured by DuPont Kabushiki Kaisha, of Tokyo, Japan, plastic resin, synthetic quartz glass, or the like. The pellicle may be from about 2 μm thick to about 5 μm thick, but these are only examples, and other thicknesses may be used.

A pellicle frame 13 is to be mounted between the photomask 11 and the pellicle 12. The pellicle frame may be made of a variety of rigid materials, such as aluminum or plastic. The frame 13 may be a round or rectangular frame, with a suitable thickness which may be from about 6 mm (¼ inch) to about 11 mm (7/16 inch). Other suitable thicknesses may be used to provide rigidity and to maintain the top surface of pellicle 11 (the surface further from the mask 11) at a suitable distance from the mask, so that particles on the pellicle 11 do not form defects in the wafer pattern during scanning. The pellicle film 12 is stretched to remove slack and adhered to the pellicle frame 13 with an adhesive, such as a 1 μm film of fluorocarbon resin.

A suitable adhesive 14 is used to attach the pellicle frame 13 to the photomask 11. For example, adhesive 14 may be a pressure sensitive adhesive.

The photomask 11 and pellicle 12/frame 13 assembly are joined inside an enclosure or chamber 16. In some embodiments, the enclosure 16 may be sealable. The chamber 16 has at least one port 18, and may optionally have a second port 19. In an embodiment having a single port 18, the single port 18 is used to first evacuate the chamber 16 to vacuum pressure, and then to fill the chamber 16 with a desired atmosphere 17 (e.g., an extreme clean dry air (XCDA), or an inert gas, such as nitrogen, helium, argon or the like). In other embodiments with two ports 18, 19, an outlet port 19 is used to vacuum out the air 20 from the chamber 16, and an inlet port 18 is then used to feed a desired atmosphere 17 (e.g., an inert gas, such as nitrogen) into the chamber 16. The XCDA or inert gas may be supplied for a period of time to flush out any remaining oxygen, moisture and other undesired components. The ports 18 and 19 may have any suitable gas valves, and may be manually or automatically controllable.

A vacuum UV light source 15 is provided in the chamber 16. The light may be provided by an ArF excimer laser at 193 nm wavelength, or a xenon (Xe) excimer laser at 172 nm wavelength.

In a preferred assembly method, the undesired chemicals inside the space 21 enclosed between the photomask 11, pellicle 12 and frame 13 are exposed to VUV light and purged by XCDA or an inert gas 17, such as pure nitrogen, helium, or argon, during the pellicle mounting process. After the photomask 11, and pellicle 12 with frame 13 attached are placed in the chamber 16, the chamber 16 is evacuated through exhaust port 19 and then flushed with the XCDA or inert gas 17 for a sufficient period of time to exhaust all air from the chamber 16. Either before or while the chamber 16 is being flushed with the XCDA or inert gas 17, the VUV light source 15 is turned on. Thus, the portion of the atmosphere 17 between the photomask 11 and the pellicle 12 is irradiated with the light from the VUV light source 15 before, during and after the step of attaching the pellicle frame 13 to the photomask 11. In this way, the source for "growing Haze" is eliminated.

The XCDA or inert gas 17 inside the chamber is pressurized before, during and after the joining step, so that sealing the pellicle frame 13 to the photomask 11 creates a pressurized enclosure 21 filled with the XCDA or inert gas. By pressurizing the enclosed atmosphere 17 in the space 21 between the photomask 11 and pellicle 12, the subsequent ingress of atmospheric air or chemical vapors into the space 21 is avoided. The adhesive 14 between the photomask 11 and pellicle frame 13 forms a first hermetic seal, and the adhesive joining the pellicle 12 to the frame 13 forms a second hermetic seal, to prevent both ingress of air and chemicals into the space 21 and egress of the XCDA or inert gas 17 from space 21.

In some embodiments, an automated pellicle mounter is installed in the chamber 16. The pellicle mounter may be an 8000 series pellicle mounter by Micro Lithography, Inc. (MLI) of Sunnyvale, Calif., but other pellicle mounters may be used. For example, pellicle mounters of the types described in any one of U.S. Pat. No. 4,637,713 (Shulenberger et al.), U.S. Pat. No. 5,311,250 (Suzuki et al.) or U.S. Pat. No. 6,619,359 (Ballard et al.) may be used. The pellicle mounter may be controlled manually or automatically. Manual control may be provided by way of an additional port (not shown) in chamber 16. An automatically controlled pellicle mounter may be operated using an on-board battery for power, or power may be supplied through a power terminal (not shown) in the chamber 16. The apparatus may operate on a timer, or may be controlled via a wired or unwired interface.

The pellicle mounter may be of a type adapted to mount a single pellicle on one side of the photomask, or of a type that mounts a pair of pellicles on both sides of the photomask.

FIG. 2 shows the finished product comprising a mask 11, a pellicle frame 13 sealingly attached to the mask 11, and a pellicle 12 joined to the pellicle frame 13. A sealed enclosure 21 is formed, and is bounded by the mask 11, the pellicle frame 13 and the pellicle 12. The sealed enclosure 21 is filled with an inert gas 17. The assembly has been formed by irradiating the mask 11 with a vacuum ultraviolet light (e.g., having a wavelength of 193 nm or 172 nm) in an XCDA or inert gas atmosphere 17, and sealing the mask 11, the pellicle frame 13 and the pellicle 12 together in the XCDA or inert gas atmosphere 17.

Figure 3:
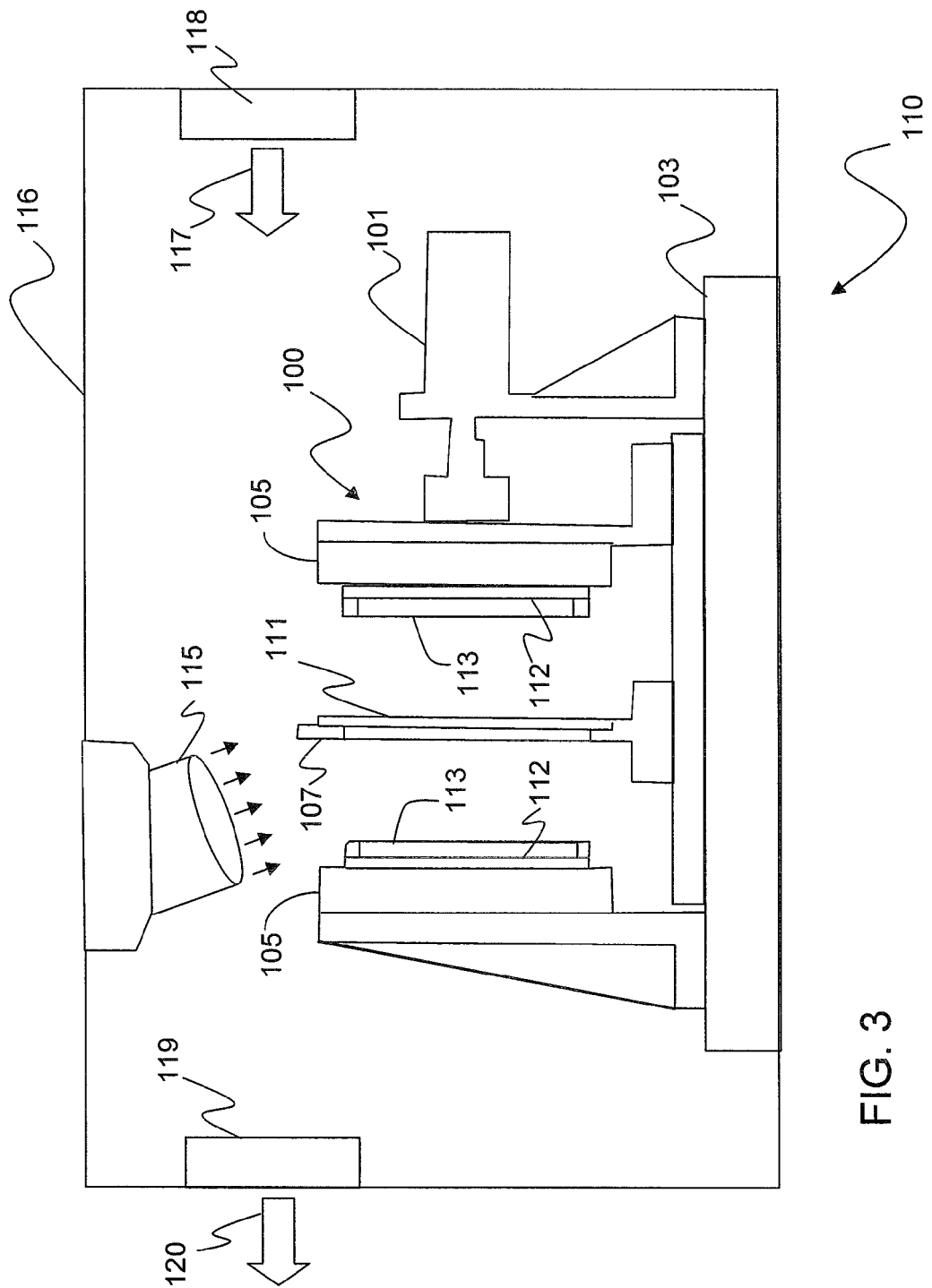
FIG. 3 is a diagram of a pellicle mounter capable of mounting pellicles on both sides of a mask.

FIG. 3 is a diagram of another apparatus 110 for mounting a pellicle 112 to a photomask 111. The pellicle mounter of FIG. 3 is of a type described in U.S. Pat. No. 5,311,250, but this is only an example, and other pellicle mounters may be used. The pellicle mounter 100 of FIG. 3 is capable of mounting pellicles 112 on both sides of photomask 111, but a variety of other pellicle mounters may be used.

The apparatus 110 includes a sealable chamber 116 having at least one port 118, 119 for filling the sealable chamber 116 with XCDA or an inert gas 117. A pellicle mounter 100 is provided within the sealable chamber 116. A vacuum ultra violet light source 115 is provided for irradiating a mask 111 held by a mask holder 107 of the pellicle mounter 100 while the chamber 116 is filled with the XCDA or inert gas 117.

The VUV light source 115 is positioned above the photomask 111 at an oblique angle, to permit irradiation with the pellicles 113 on both sides of the photomask 111. The light source provides light having a wavelength or 172 nm or 193 nm. For example, the light source 115 may be a Xenon excimer laser.

The chamber 116 has a first port 118 for charging the sealable chamber 116 with XCDA or an inert gas 117, and a second port 119 for evacuating air 120 and contaminants from the sealable chamber. A steady flow of the XCDA or inert gas 117 can be maintained to flush out any remaining impurities from the mask 111.

The pellicle mounter 100 has a controller 101, and is capable of automatic operation, either under control of an internal timer in controller 101, or a wired or wireless communication link with a processor (not shown). Power may be supplied to the pellicle mounter through a connection (not shown) in the base 103, or by a battery (not shown) for example.

In the example of FIG. 3, the VUV light source 115 is positioned above the photomask 111 at an oblique angle, to permit irradiation with the pellicles 113 on both sides of the photomask 111. In other embodiments, the light source 115 may be embedded within one or both of the pellicle holders 105, to irradiate the photomask throughout the pellicle mounting step.

Figure 4:
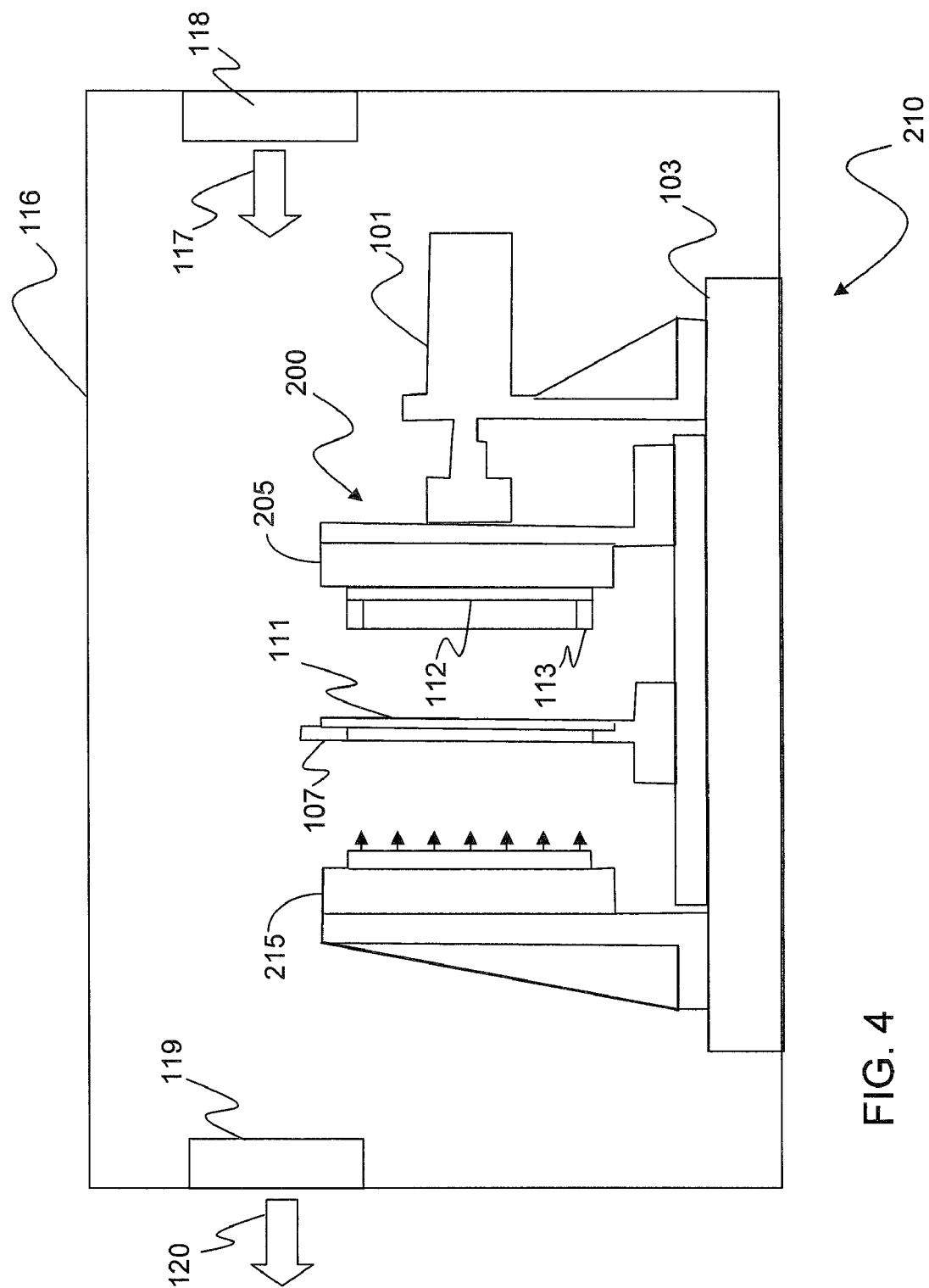
FIG. 4 is a diagram of a variation of the apparatus in FIG. 3.

FIG. 4 shows an apparatus 210 similar to that shown in FIG. 3, except that the light source 215 is positioned within the pellicle mounter 200 in place of one of the pellicle holders 105. The light source 215 may be placed behind a transparent plate, to provide a rigid, flat, smooth, transparent surface to engage the mask holder 107, while permitting the VUV light to pass on to the mask 111.

Figure 5:
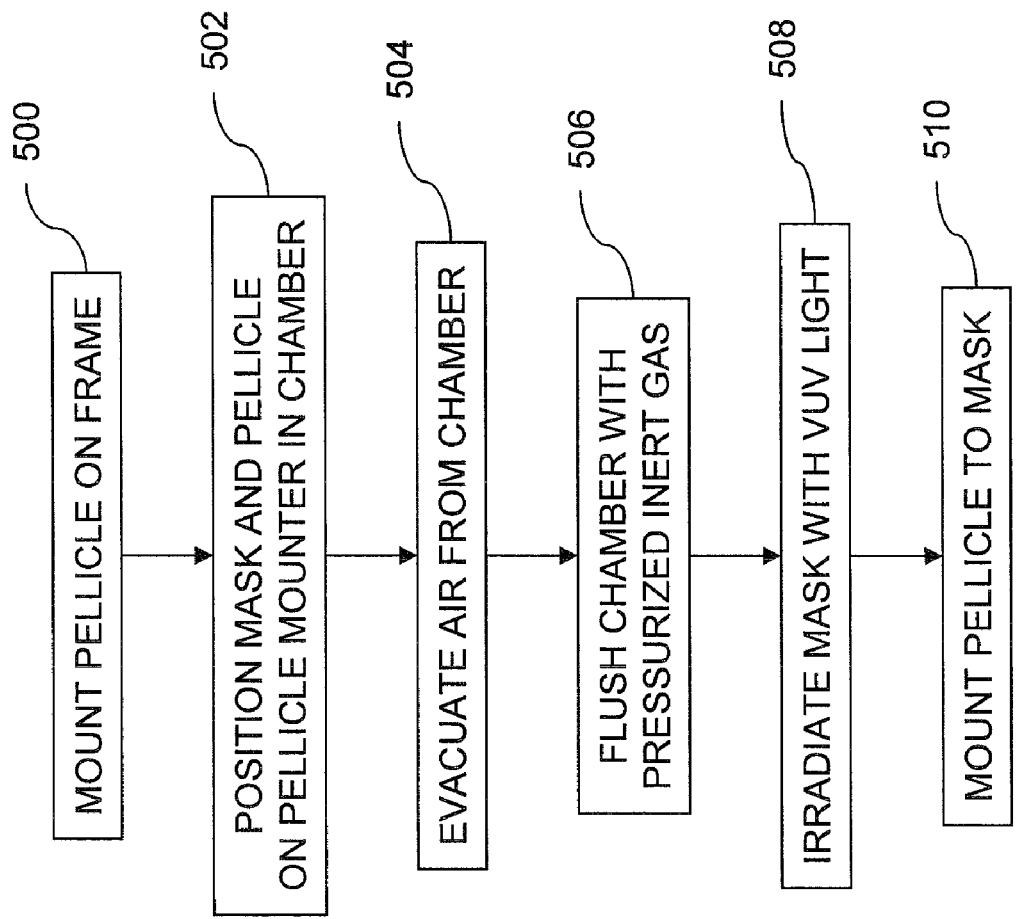
FIG. 5 is a flow chart of a method for mounting a pellicle to a mask.

FIG. 5 is a flow chart of a method for mounting a pellicle to a mask.

At step 500, a pellicle 112 is mounted to a pellicle frame 113.

At step 502, the mask 111 and pellicle 112 are positioned on the pellicle mounter within the chamber 116. The chamber is closed.

At step 504, the air 120 is evacuated from the chamber 116.

At step 506, the chamber 116 is flushed with pressurized XCDA or inert gas 117. The gas flow 117 can continue throughout the remainder of the mounting process.

At step 508, the mask 111 is irradiated with VUV light.

At step 510, the pellicle 112 is mounted to the mask 111, while the light source continues to provide VUV light and the inert gas is pumped into the chamber 116 under pressure. The adhesive between the mask 111 and the pellicle frame 113, and the adhesive between the pellicle frame 113 and the pellicle 112 form hermetic seals to maintain the inert gas under pressure within the space between the mask 111, pellicle 112 and frame 113.

By using the method of FIG. 5, haze is reduced or eliminated, and the risk of low wafer yield is reduced. The mask lifetime before repair is extended. Time is saved, because haze is reduced or eliminated, eliminating the need for frequent mask reworking (pellicle de-mounting, re-cleaning, defect inspection, CD measurement.) Expenses can be reduced.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method, comprising:
    irradiating a mask with a vacuum ultra violet (VUV) light in a pressurized atmosphere of extreme clean dry air (XCDA) or an inert gas, and
    mounting by attaching a pellicle to the mask using a pressure sensitive adhesive while the mask is in the atmosphere of XCDA or inert gas and exposed to the VUV light thereby forming a pressurized enclosure between the pellicle and the mask.

2. The method of claim 1, wherein the inert gas is nitrogen.

3. The method of claim 1, further comprising .sealing the pellicle to the mask so as to prevent ingress of contaminants or egress of the XCDA or inert gas.

4. The method of claim 1, wherein the irradiating step includes using an excimer laser.

5. The method of claim 4, wherein the excimer laser has a wavelength of 193 nm.

6. The method of claim 4, wherein the excimer laser has a wavelength of 172 nm.

7. The method of claim 1, wherein:
    the inert gas is nitrogen,
    the irradiating step includes using a Xenon excimer laser having a wavelength of 172 nm, and
    the method further comprises sealing the pellicle to the mask so as to prevent ingress of contaminants or egress of the inert gas.

8. The method of claim 1, wherein the irradiating step includes irradiating before, during and after attaching the pellicle frame to the mask.

* * * * *